US009787332B2

(12) United States Patent
Guilford et al.

(10) Patent No.: US 9,787,332 B2
(45) Date of Patent: Oct. 10, 2017

(54) ERROR-CHECKING COMPRESSED STREAMS IN HETEROGENEOUS COMPRESSION ACCELERATORS

(71) Applicant: Intel Corporation, Santa Clara, CA (US)

(72) Inventors: James D. Guilford, Northborough, MA (US); Vinodh Gopal, Westborough, MA (US); Laurent Coquerel, Limerick (IE)

(73) Assignee: Intel Corporation, Santa Clara, CA (US)

( * ) Notice: Subject to any disclaimer, the term of this patent is extended or adjusted under 35 U.S.C. 154(b) by 29 days.

(21) Appl. No.: 14/854,647

(22) Filed: Sep. 15, 2015

(65) Prior Publication Data
US 2017/0077964 A1     Mar. 16, 2017

(51) Int. Cl.
*H04L 1/00*     (2006.01)
*H03M 13/00*    (2006.01)
*G06F 11/10*    (2006.01)

(52) U.S. Cl.
CPC ..... *H03M 13/6312* (2013.01); *G06F 11/1076* (2013.01)

(58) Field of Classification Search
CPC .................................................. H04L 1/0057
USPC ........................................ 714/776, 748, 819
See application file for complete search history.

(56) References Cited

U.S. PATENT DOCUMENTS

| 4,754,483 A * | 6/1988 | Weaver ............. H03H 17/0264 360/51 |
|---|---|---|
| 5,894,486 A | 4/1999 | Katsube |
| 2004/0133836 A1 | 7/2004 | Williams |
| 2009/0172503 A1 | 7/2009 | Takanashi |
| 2014/0122964 A1 | 5/2014 | Chen |
| 2014/0156790 A1 | 6/2014 | Gopal et al. |
| 2015/0347705 A1 * | 12/2015 | Simon ................. G06F 19/3431 705/3 |

OTHER PUBLICATIONS

International Search Report and Written Opinion of International Patent Application No. PCT/US2016/046061, dated Nov. 8, 2016, 10 pages.

(Continued)

*Primary Examiner* — Fritz Alphonse
(74) *Attorney, Agent, or Firm* — Lowenstein Sandler LLP

(57) ABSTRACT

A compression engine may be designed for more efficient error checking of a compressed stream, to include adaptation of a heterogeneous design that includes interleaved hardware and software stages of compression and decompression. An output of a string matcher may be reversed to generate a bit stream, which is then compared with an input stream to the compression engine as a first error check. A final compressed output of the compression engine may be partially decompressed to reverse entropy code encoding of an entropy code encoder. The partially decompressed output may be compared with an output of an entropy code generator to perform a second error check. Finding an error at the first error check greatly reduces the latency of generating a fault or exception, as does performing computing-intensive aspects of the compression and decompression with software instead of specialized hardware.

23 Claims, 11 Drawing Sheets

(56) References Cited

OTHER PUBLICATIONS

Ziv, J. et al., "A Universal Algorithm for Sequential Data Compression," IEEE Transactions on Information Theory, vol. IT-23, No. 3, pp. 337-343 (May 1977).
Huffman, David A., "A Method for the Construction of Minimum-Redundancy Codes," Proceedings of the I.R.E., pp. 1098-1101 (Sep. 1952).
"Data Compression—Exar," Exar Corporation, Fremont California, accessed at https://www.exar.com/data-compression/ on Aug. 17, 2015.
Deutsch, P. "RFC 1951—DEFLATE Compressed Data Format Specification version 1.3," Network Working Group, 15 pages, accessed at http://www.faqs.org/rfcs/rfc1951.html (May 1996).

* cited by examiner

(12)  United States Patent

ERROR-CHECKING COMPRESSED STREAMS IN HETEROGENEOUS COMPRESSION ACCELERATORS

The present disclosure pertains to the field of memory management and, in particular, to optimizing error checking compressed streams in heterogeneous compression accelerators.

BACKGROUND

Hardware accelerators provide an opportunity to achieve orders-of-magnitude performance and power improvements with customized circuit designs. As technology has advanced, however, so has the amount of data needing to be processed, stored and transmitted. So-called big data is a big part of today's technology solutions, and with it, advanced solutions for compression and decompression so that more data can be stored and transmitted in less space (or requiring less bandwidth) than ever before. The challenge exists, however, of detecting silent data corruption in hardware engines that perform compression. The issue of soft errors (SER) is known, but these are generally detectable. The problem is severe, however, when an error goes undetected during a compression operation. Algorithms that generate highly compressed streams suffer from the problem that a corrupted stream is very hard to recover data from; in the worst case, all data after the point of corruption is lost.

Most current solutions rely on simply hardening the structures used in the compressors, such as error correction code (ECC)-protected RAMs or parity protected buses. But, if there is an undetected multiple-bit error, or an event in the computation data-path logic, it is not clear whether these can be avoided except using probabilistic methods, which are by their nature inexact. Some developers claim to have developed a full decompression operation as an error check on compression, but this solution is expensive as it requires significant hardware resources and also adds significant latency to an application's processing pipeline.

DESCRIPTION OF EMBODIMENTS

Figure 1:
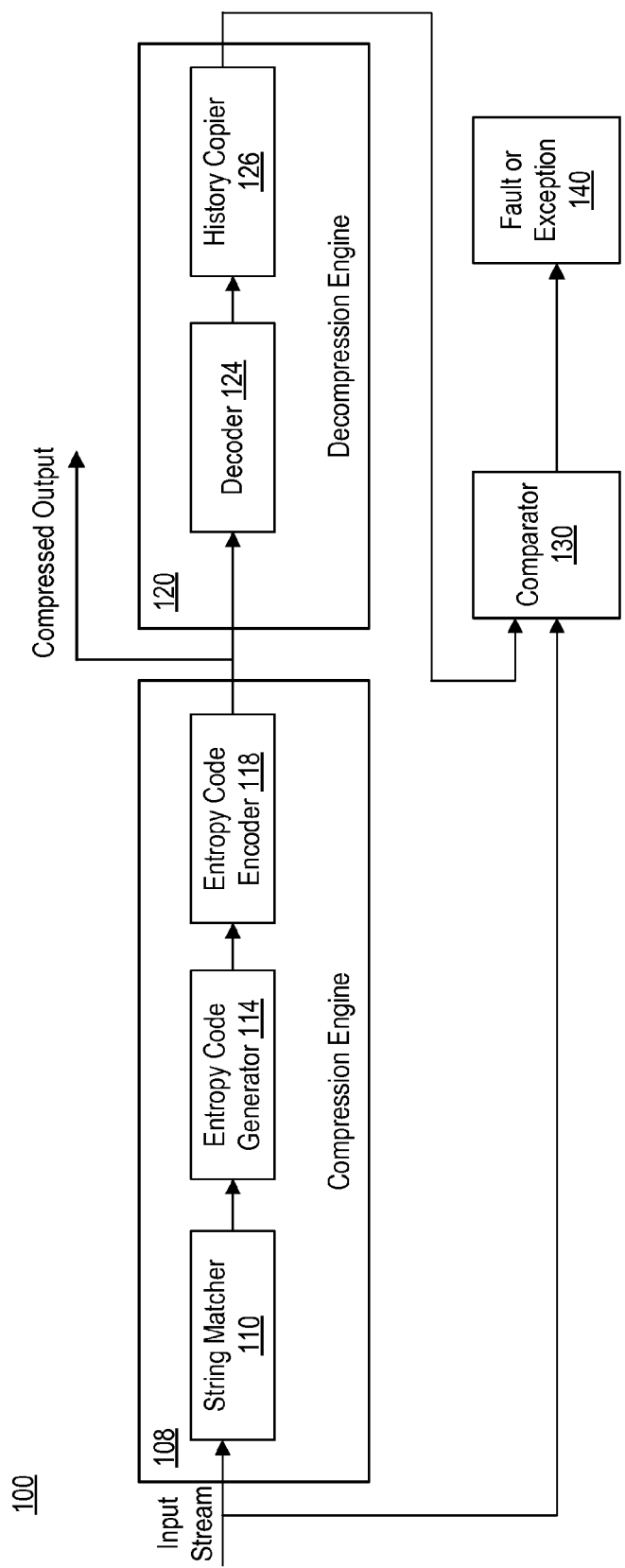
FIG. 1 is a diagram of an exemplary error-checking system with full compression and decompression engines.

One solution to the expensive impacts on application processing when employing full decompression as an error check on compression is to use a heterogeneous (or hybrid) compression and decompression design that uses both hardware and software. These engines are much smaller because less hardware is required, but at the expensive of some software processing. Providing error checking in these heterogeneous models may produce additional challenges, including added latency in detecting errors. This may be due to the multiple hardware-software interactions that are in the critical path of processing flow of an application. The present disclosure presents a solution to implement error detection within a compressed stream with reduced latency, better than doing a full compression followed by a full decompression, using a heterogeneous compression and decompression engine.

In one example, a compression engine may be redesigned for more efficient error checking of a compressed stream, to include adaptation of a heterogeneous design that includes interleaved hardware and software stages of compression and decompression. An output of a hardware string matcher may be reversed to generate a bit stream, which is then compared with an input stream to the compression engine as a first error check. This reverse operation may be performed in software, and provide an error check early on in the compression process. A final compressed output of the compression engine may be partially decompressed to reverse entropy code encoding of an entropy code encoder. The partially decompressed output may be compared with an output of an entropy code generator to perform a second error check. Finding an error at the first error check greatly reduces the latency of generating a fault or exception, as does performing computing-intensive aspects of the compression and decompression with software instead of specialized hardware.

In another example, an error-checking, data compression system may include a compression engine having a plurality of compression stages to compress an input stream of data. A first compression stage may include a hardware matcher to string match various substrings of the input stream and to generate an intermediate token format of respective substring matches. In one embodiment, the first compression stage may include an LZ77 compressor. A second compression stage may include a processor core to execute first instructions as an entropy code generator to generate entropy codes from frequencies of tokens corresponding to respective substring matches. In one embodiment, the entropy code generator is a tree generator to generate a Huffman tree from the frequencies of tokens. A third compression stage may include a hardware entropy code encoder to encode a final compressed output of the input stream utilizing the entropy codes. In one embodiment, the entropy code encoder may be a Huffman encoder that generates the final compressed output from the Huffman tree.

Multiple decompression stages may be interposed within the multiple compression stages to provide the error checking. For example, in a first decompression stage, the processor core may execute second instructions as an inverse string matcher to generate a bit stream from the intermediate token format of respective substring matches. The first decompression stage may also include a first comparator to compare the input stream with the bit stream and to generate a first fault or exception in response to determining an error in matching the input stream and the bit stream. A second decompression stage may include a hardware decoder to partially decompress the final compressed output, to reverse encoding of the entropy code encoder, generating a partially decompressed output. The second decompression stage may include a second comparator to compare the final compressed output to the partially decompressed output and to generate a second fault or exception in response to determining an error in matching the output of the entropy code generator to the partially decompressed output.

FIG. 1 is a diagram of an exemplary error-checking system 100 with a compression engine 108 and a decompression engine 120, where the system 100 may be implemented as a processor or other device. In this example, the system 100 is designed with a full decompression in order to perform error checking. The compression engine 108 may compress an input stream to generate a final compressed output. The decompression engine 120 may decompress the final compressed output to generate a decompressed output to compare with the input stream, and generate any fault or exception upon finding a mismatch between the decompressed output and the input stream.

More specifically, the compression engine 108 may include a string matcher 110, an entropy code generator 114 and an entropy code encoder 118. Any of the string matcher 110, the entropy code generator 114 or the entropy code encoder 118 may be performed by executing instructions by at least one processor core of the system 100, e.g., to be performed in software. The string matcher 110 may string match various substrings of the input stream and generate an intermediate token format of respective substring matches, e.g., create tokens for each literal or back reference depending on matching substrings. In one example, the string matcher 110 is a LZ77 compressor. The entropy code generator 114 may execute entropy—or other arithmetic—algorithm to generate entropy codes from frequencies of tokens corresponding to respective substring matches. In one embodiment, the entropy code generator 114 is a tree generator to generate a Huffman tree from the frequencies of the tokens. The entropy code encoder 118 may then encode a final compressed output of the input stream utilizing the entropy codes. In one embodiment, the entropy code encoder is a Huffman encoder that generates the final compressed output from the Huffman tree.

The decompression engine 120 may include a decoder 124 and a history copier 126. The decoder 124 may decode the final compressed output and use the history copier 126, which accesses a history copy stored in a history buffer of the decompression engine 120, to create an output bit stream according to the literals and backward references located within the encoding. More specifically, the decoder 124 may parse the compressed stream into tokens that represent literal bytes or references to repeated strings. The history copier 126 may then copy strings from the literal bytes or from the backwards references into the output stream, where references are in the most recent 32 KB of history. Either or both of the decoder 124 and the history copy 126 may be performed in software. Where the history copy 126 block is executed by a CPU or other processor core, the history copy 126 block may reduce a decompression engine by a factor of about 15.

The system 100 may further include a comparator 130 to compare the output bit stream with the input stream of data, which generates a fault or exception (indicating an error) in response to determining a mismatch between the output bit stream and the input stream. The comparator 130 may compare every byte in input and output buffers for equality, or may compute some checksum (e.g., cyclic redundancy check (CRC)) of the respective buffers and then check to see that the checksums are the same. Either of these two approaches may be used by any comparator described herein.

The system 100 may employ, in one example, the standard DEFLATE compression algorithm that is widely used. The DEFLATE forms the basis for formats such as gzip/Zlip™ as well as Winzip® (or PKZIP®). The DEFLATE standard data format includes a series of blocks, corresponding to successive blocks of input data. Each block is compressed using a combination of the LZ77 algorithm and Huffman coding. The LZ77 algorithm finds repeated substrings and replaces them with backward references, e.g., relative distance offsets. The LZ77 algorithm can use a reference to a duplicated string occurring in the same or previous blocks, up to 32K input bytes back within the buffer. The compressed data may include a series of elements of two types: literal bytes and pointers to replicated strings, where a pointer is represented as a pair <length, backward distance>. Other encoding data formats may also be employed, and reference to the DEFLATE format is not be construed as limiting, but as exemplary.

Figure 2:
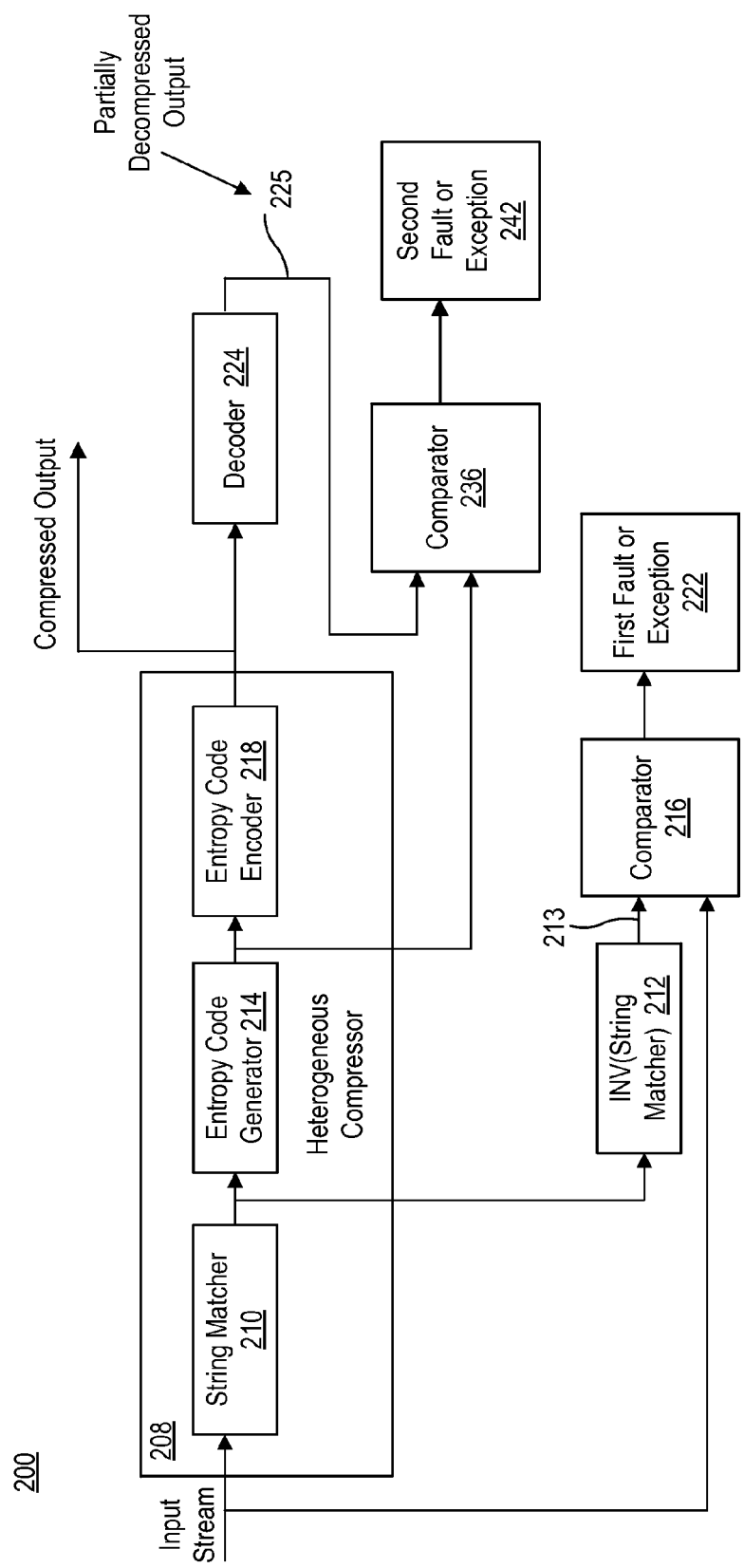
FIG. 2 is a diagram of an exemplary error-checking system with a heterogeneous compression and decompression engine without full decompression.

FIG. 2 is a diagram of another exemplary error-checking system 200 with a heterogeneous compressor 208 and interleaved stages of decompression for error checking a compressed stream, during and after compression. The heterogeneous compressor 208 may include, similar to the compression engine 108 of FIG. 1, multiple compression stages and may implemented by a processor or other processing device. These compression stages may include, for example, a string matcher 210 (first compression stage), an entropy code generator 214 (second compression stage) and an entropy code encoder 218 (third compression stage), with similar functionality as discussed with reference to FIG. 1, to generate a final compressed output.

In one embodiment, while the string matcher 210 may be a hardware string matcher and the entropy code encoder 218 may be a hardware entropy code encoder, a processor core or other CPU may execute instructions to implement the entropy code generator 214 as software. Because this second compression stage is computationally intensive, executing the entropy code generator 214 as software may greatly reduce the size of the heterogeneous compressor 208.

Different than FIG. 1, however, FIG. 2 illustrates error-checking decompression stages interleaved between and after the compression stages. More specifically, a first decompression stage may include an inverse string matcher 212 to perform an inverse operation on an output from the string matcher 210, to generate a bit stream 213. A comparator 216 may compare the bit stream 213 with the input stream, generating a first fault or exception 222 responsive to determining any mismatch between the bit stream 213 and the input stream. Given no errors from an output of the string matcher 210, the bit stream 213 should be the same as the input stream. Accordingly, the inverse string matcher 212 performs the same or a similar functionality as the history copier 126 block of the decompression engine 120 of FIG.

1. In one embodiment, at least one processor core executes instructions to implement the inverse string matcher 212 as software.

Additionally, a second decompression stage may remove the history copier employed in the system 100 of FIG. 1. This removal leaves a decoder 224 (such as a hardware decoder) with which to partially decompress the final compressed output to reverse encoding performed by the entropy code encoder 218, generating a partially decompressed output 225. A comparator 236 may then compare an output of the entropy code generator 214 to the partially decompressed output 225, and generate a second fault or exception 242 when the output of the entropy code generator 214 does not match the partially decompressed output 225. By performing the inverse string matcher 212 in software and removing the history copy (seen in FIG. 1), the entire size of the decompression stages employed for error checking is greatly reduced and the error checking is made more efficient. The decoder 224 and the comparator 236 may be executed in specialized hardware in one example.

The faults or exceptions may be generated as machine check architecture fault (MCA), which may be catastrophic, usually resulting in a notification of highest priority interrupt(s) to avoid propagating an error within data throughout a computing system. Any such MCAs may be recorded in a log and reported to an administrator or IT personnel for analyzing, or be analyzed in an automated fashion and results thereof reported to such personnel. Advantageously, the system 200 of FIG. 2 provides improved granularity of error detection, in that the first faults or exceptions 222 may be logged, tracked and reported separately from faults or exceptions 242 detected in the final compressed output.

The way to prove that the data of the compressed stream has been uncorrupted during compression is to prove two sub-problems with the decompression stages of FIG. 2. First, the actual matches or literal bytes that the string matcher 210 finds are correct. Thus, software uses the string matcher token stream and performs an inverse operation (a type of LZ77 "decompress," in one embodiment). The operation of the comparator 216 may then assert that these match the original input stream. Second, given that the bit stream 213 output by the inverse string matcher 212 contains no errors, the second decompression stage proves that the encoder did not generate a faulty compressed stream. Here, the partial hardware decompressor block (e.g., the decoder 224) may perform a Huffman decode, in one embodiment, and compare the output with the tokened stream coming out of the entropy code generator 214 (which in one embodiment, by be a Huffman tree generator).

Note that the first decompression stage (performed by the inverse string matcher 212) can be done very early, hence can feed an early MCA error check. Indeed, given a swift enough check, this first decompression stage is provided for free (no additional latency). The entropy (or Huffman) encode and decode steps are verified later, but still faster than in FIG. 1 as the system 200 checks from the first stage of the decompressor. The early check can be done even before entropy codes or Huffman trees are generated, thus adding no time to latency of normal processing.

The timing to get the first error detected can be illustrated by an example. Let us assume we create a DEFLATE block for every 128 KB of input data (a reasonable assumption from real usages). We also assume that input buffers are allocated in 32 KB chunks, and thus there are four compress calls made per block. Assuming a high level of Zlib™ compression, the string matcher 210 runs about 8 cycles/byte, needing about 250K cycles per compress call (and about 1M cycles for the full block). The entropy code (or tree) generation is about 50K cycles, and we assume latency through the encode and decode blocks is about 1K cycles each, and the last history copier has a latency of about 20 cycles.

In the compression and full decompression design of FIG. 1, the earliest time the system 100 may detect an error is at about 1M+50K+2K+20 cycles. In the design of FIG. 2, assuming the error is the string matcher stage (most likely SER event), time to detect the first error is: 250K*i cycles where i=1,2,3,4 depending on which call to compress had the event. Accordingly, the earlier the error detection, the lower the latency.

In the design of the system 200 of FIG. 2, if the error happens during the entropy code encoder 218 encoding flow, then the system 100 may report the error at 1M+50K+2K cycles as a worst case. So, the system 200 may detect errors much faster (up-to about 4× faster in this example when the error happened in the first call, e.g., after the string matcher 210). Note also that a full decompressor itself adds significant probability of having a SER event in the decompressor, adding to the generation of false negatives.

Figure 3:
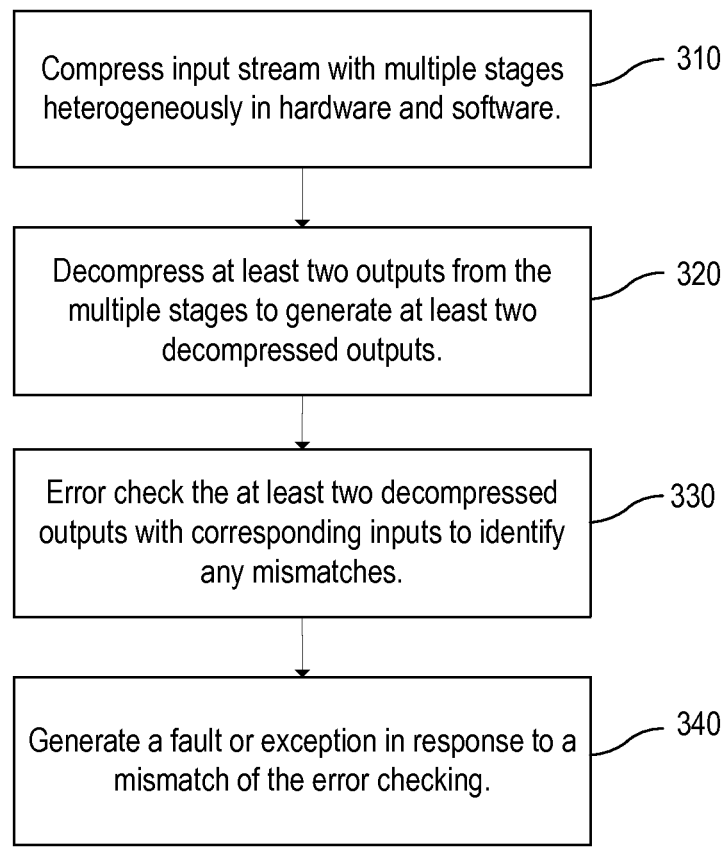
FIG. 3 is a flowchart of an exemplary method for error checking a compressed stream employing the heterogeneous design of the system of FIG. 2.

FIG. 3 is a flowchart of an exemplary method for error checking a compressed stream employing the heterogeneous design of the system 200 of FIG. 2. A compression engine of the system 200 may compress an input stream with multiple compression stages heterogeneously in hardware and software (310). The system 200 may also decompress at least two outputs from the multiple compression stages to generate at least two decompressed outputs (although the outputs may not be fully decompressed) (320). The system 200 may further error check the at least two compressed outputs with corresponding inputs to identify any mismatches (330). The system 200 may also generate a final or exception (such as an MCA) in response to a mismatch of the error checking (340).

Figure 4:
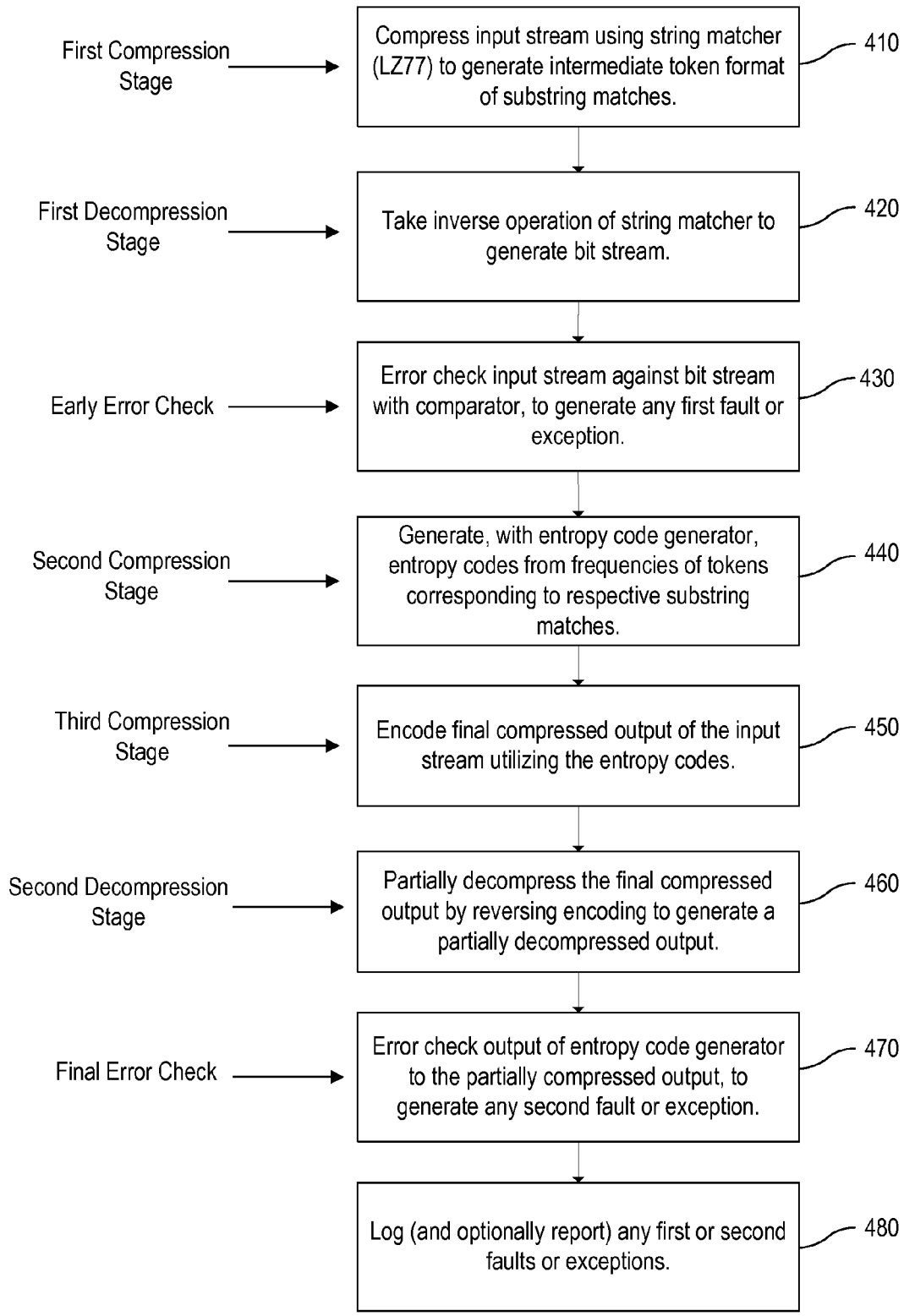
FIG. 4 is a flowchart of another exemplary method for error checking a compressed stream employing the heterogeneous design of the system of FIG. 2.

FIG. 4 is a flowchart of another exemplary method for error checking a compressed stream employing the heterogeneous design of the system 200 of FIG. 2. The system 200 may begin with compressing an input stream in a first compression stage using a string matcher (such as a LZ77 compressor) to generate an intermediate token format of substring matches, with a token for each literal for singles and for each backward reference to a substring match (410). The system 200, in a first decompression stage, may take an inverse operation of the string matcher to generate a bit stream (420). The system 200 may then perform an early error check by comparing the input stream to the bit stream with a comparator, to generate any first fault or exception (such as an MCA) (430).

The method of FIG. 4 may continue with the system 200, in a second compression stage, generating, with an entropy code generator, entropy codes from frequencies of tokens corresponding to respective substring matches (440). In one embodiment, the entropy code generator may be a tree generator that generates a Huffman tree from the frequencies of the tokens. In other embodiments, other arithmetic or entropy algorithms may be employed. The system 200 may further, in a third compression stage (e.g., employing an entropy code encoder), encode a final compressed output of the input stream utilizing the entropy codes (450). In one embodiment, the third compression stage may be a Huffman encoder. In another embodiment, the third compression stage may be an arithmetic or other entropy code encoder.

The method of FIG. 4 may continue in a second decompression stage with, using a decoder, partially decompressing the final compressed output to reverse encoding of the third compression stage, to generate a partially decompressed output (460). The system 200 may then, using a comparator, perform an error check of the output of the entropy code generator to the partially compressed output, generating any second fault or exception (which may be an MCA or similar fault) in response to determining an error in matching the output of the entropy code generator to the partially decompressed output (470). The system 200 may also log and optionally report any first fault or exception and any second fault or exception (480), providing a higher level of granularity to when and what causes such faults or exceptions.

Figure 5:
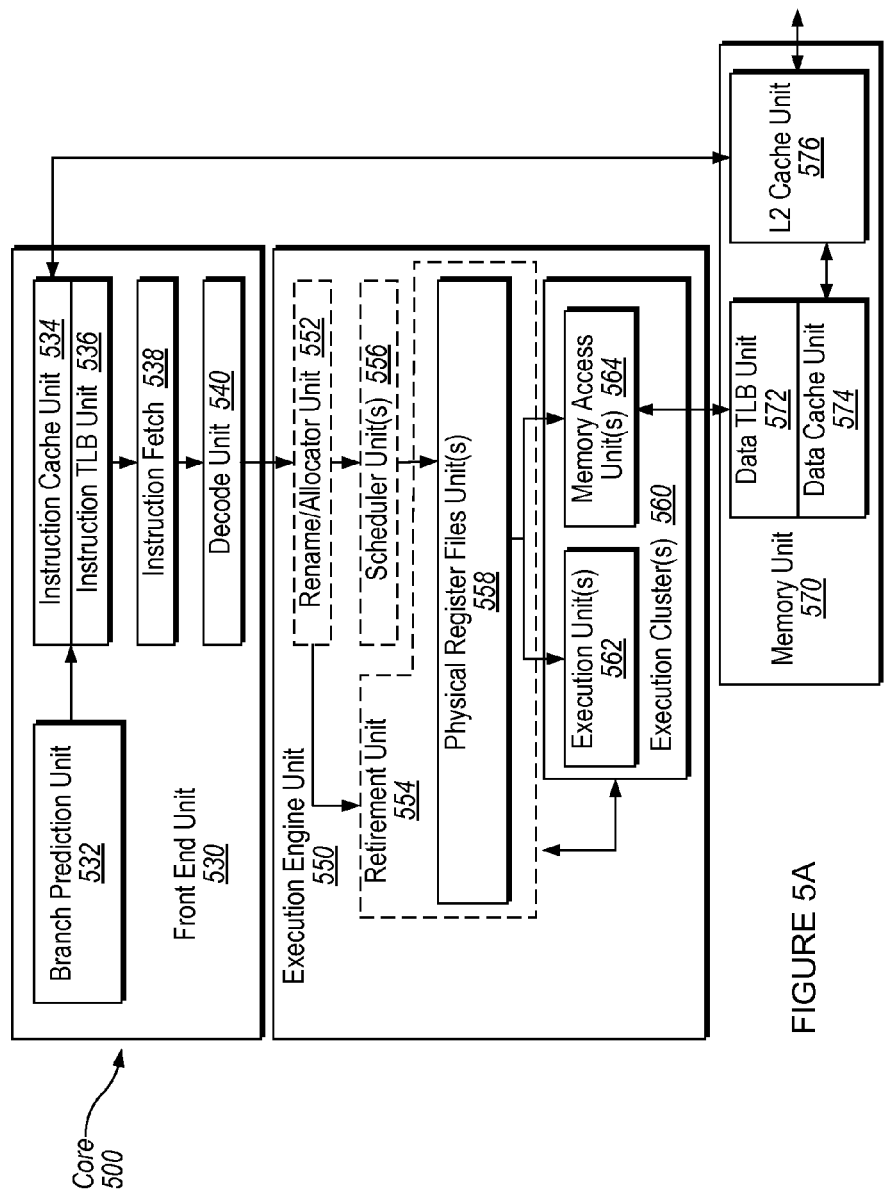
FIG. 5A is a block diagram illustrating an in-order pipeline and a register renaming stage, out-of-order issue/execution pipeline according to one embodiment.
FIG. 5B is a block diagram illustrating a micro-architecture for a processor that implements compression/decompression optimization in solid-state memory devices according to one embodiment.

FIG. 5A is a block diagram illustrating a micro-architecture for a processor core 500 that may execute the system 100 of FIG. 1 or the system 200 of FIG. 2. Specifically, processor core 500 depicts an in-order architecture core and a register renaming logic, out-of-order issue/execution logic to be included in a processor according to at least one embodiment of the disclosure. The embodiments of the error correcting code that carry additional bits may be implemented by processor core 500.

The processor core 500 includes a front end unit 530 coupled to an execution engine unit 550, and both are coupled to a memory unit 570. The processor core 500 may include a reduced instruction set computing (RISC) core, a complex instruction set computing (CISC) core, a very long instruction word (VLIW) core, or a hybrid or alternative core type. As yet another option, processor core 500 may include a special-purpose core, such as, for example, a network or communication core, compression engine, graphics core, or the like. In one embodiment, processor core 500 may be a multi-core processor or may be part of a multi-processor system.

The front end unit 530 includes a branch prediction unit 532 coupled to an instruction cache unit 534, which is coupled to an instruction translation lookaside buffer (TLB) 536, which is coupled to an instruction fetch unit 538, which is coupled to a decode unit 540. The decode unit 540 (also known as a decoder) may decode instructions, and generate as an output one or more micro-operations, micro-code entry points, microinstructions, other instructions, or other control signals, which are decoded from, or which otherwise reflect, or are derived from, the primary instructions. The decoder 540 may be implemented using various different mechanisms. Examples of suitable mechanisms include, but are not limited to, look-up tables, hardware implementations, programmable logic arrays (PLAs), microcode read only memories (ROMs), etc. The instruction cache unit 534 is further coupled to the memory unit 570. The decode unit 540 is coupled to a rename/allocator unit 552 in the execution engine unit 550.

The execution engine unit 550 includes the rename/allocator unit 552 coupled to a retirement unit 554 and a set of one or more scheduler unit(s) 556. The scheduler unit(s) 556 represents any number of different schedulers, including reservations stations (RS), central instruction window, etc. The scheduler unit(s) 556 may be coupled to the physical register file unit(s) 558. Each of the physical register file unit(s) 558 represents one or more physical register files, different ones of which store one or more different data types, such as scalar integer, scalar floating point, packed integer, packed floating point, vector integer, vector floating point, etc., status (e.g., an instruction pointer that is the address of the next instruction to be executed), etc. The physical register file(s) unit(s) 558 may be overlapped by the retirement unit 554 to illustrate various ways in which register renaming and out-of-order execution may be implemented (e.g., using a reorder buffer(s) and a retirement register file(s), using a future file(s), a history buffer(s), and a retirement register file(s); using a register maps and a pool of registers; etc.).

Generally, the architectural registers are visible from the outside of the processor or from a programmer's perspective. The registers are not limited to any known particular type of circuit. Various different types of registers are suitable as long as they are capable of storing and providing data as described herein. Examples of suitable registers include, but are not limited to, dedicated physical registers, dynamically allocated physical registers using register renaming, combinations of dedicated and dynamically allocated physical registers, etc. The retirement unit 554 and the physical register file(s) unit(s) 558 are coupled to the execution cluster(s) 560. The execution cluster(s) 560 includes a set of one or more execution units 562 and a set of one or more memory access units 564. The execution units 562 may perform various operations (e.g., shifts, addition, subtraction, multiplication) and operate on various types of data (e.g., scalar floating point, packed integer, packed floating point, vector integer, vector floating point).

While some embodiments may include a number of execution units dedicated to specific functions or sets of functions, other embodiments may include only one execution unit or multiple execution units that all perform all functions. The scheduler unit(s) 556, physical register file(s) unit(s) 558, and execution cluster(s) 560 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 564). It should also be understood that where separate pipelines are used, one or more of these pipelines may be out-of-order issue/execution and the rest in-order.

The set of memory access units 564 may be coupled to the memory unit 570, which may include a data prefetcher 580, a data TLB unit 572, a data cache unit (DCU) 574, and a level 2 (L2) cache unit 576, to name a few examples. In some embodiments DCU 574 is also known as a first level data cache (L1 cache). The DCU 574 may handle multiple outstanding cache misses and continue to service incoming stores and loads. It also supports maintaining cache coherency. The data TLB unit 572 is a cache used to improve virtual address translation speed by mapping virtual and physical address spaces. In one exemplary embodiment, the memory access units 564 may include a load unit, a store address unit, and a store data unit, each of which is coupled to the data TLB unit 572 in the memory unit 570. The L2 cache unit 576 may be coupled to one or more other levels of cache and eventually to a main memory.

In one embodiment, the data prefetcher 580 speculatively loads/prefetches data to the DCU 574 by automatically predicting which data a program is about to consume. Prefetching may refer to transferring data stored in one memory location (e.g., position) of a memory hierarchy (e.g., lower level caches or memory) to a higher-level memory location that is closer (e.g., yields lower access latency) to the processor before the data is actually demanded by the processor. More specifically, prefetching may refer to the early retrieval of data from one of the lower level caches/memory to a data cache and/or to prefetch buffer before the processor issues a demand for the specific data being returned.

The processor core 500 may support one or more instructions sets (e.g., the x86 instruction set (with some extensions that have been added with newer versions); the MIPS instruction set of Imagination Technologies of Kings Langley, Hertfordshire, UK; the ARM instruction set (with optional additional extensions such as NEON) of ARM Holdings of Sunnyvale, Calif.).

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes a separate instruction and data cache units and a shared L2 cache unit, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

FIG. 5B is a block diagram illustrating an in-order pipeline and a register renaming stage, out-of-order issue/execution pipeline implemented by processor core 500 of FIG. 5A according to some embodiments of the disclosure. The solid lined boxes in FIG. 5B illustrate an in-order pipeline, while the dashed lined boxes illustrates a register renaming, out-of-order issue/execution pipeline. In FIG. 5B, a processor pipeline 590 includes a fetch stage 502, a length decode stage 504, a decode stage 506, an allocation stage 508, a renaming stage 510, a scheduling (also known as a dispatch or issue) stage 512, a register read/memory read stage 514, an execute stage 516, a write back/memory write stage 518, an exception handling stage 522, and a commit stage 524. In some embodiments, the ordering of stages 502-524 may be different than illustrated and are not limited to the specific ordering shown in FIG. 5B.

Figure 6:
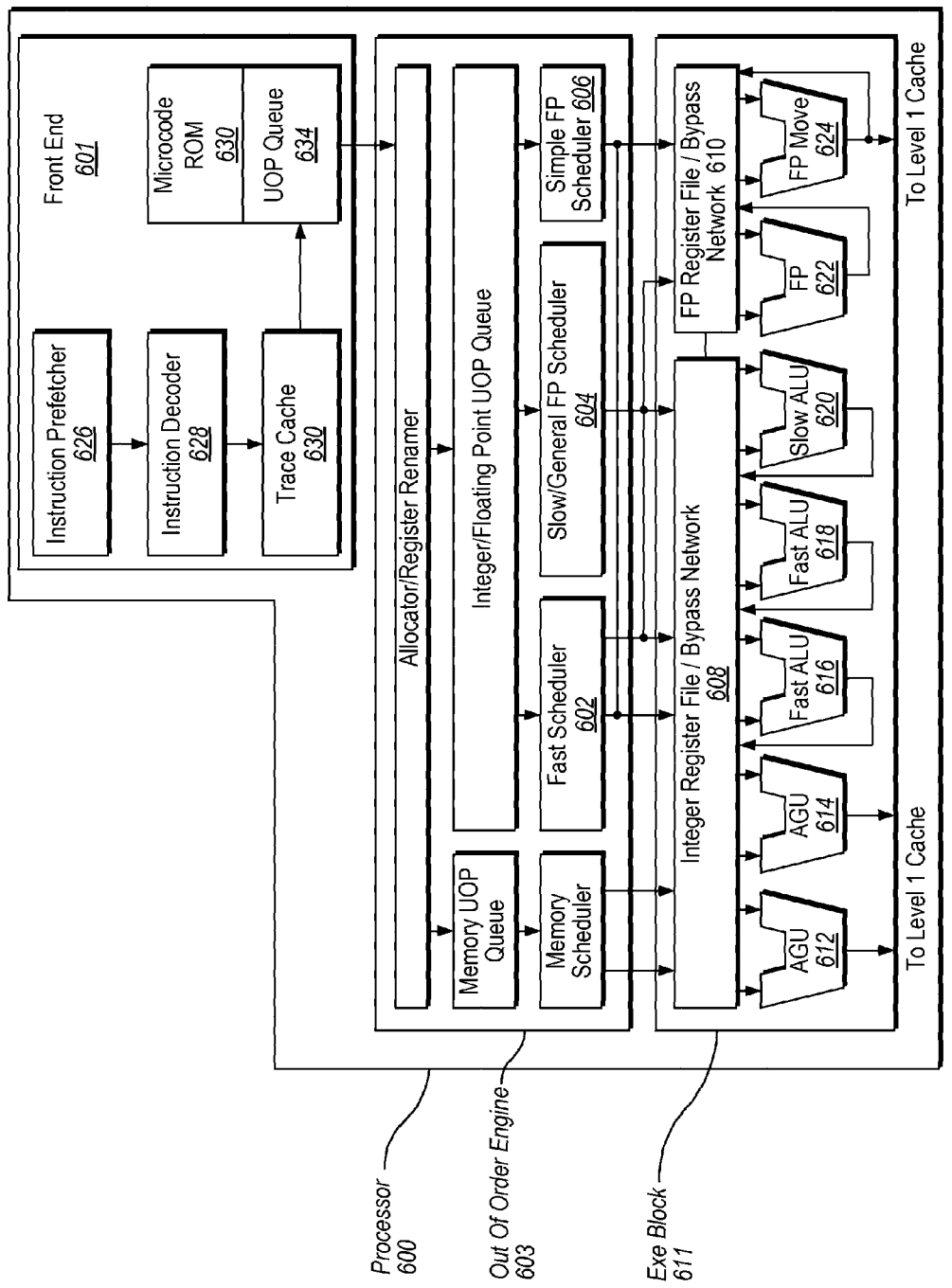
FIG. 6 illustrates a block diagram of the micro-architecture for a processor that includes logic circuits to perform compression/decompression optimization in solid-state memory devices according to one embodiment.

FIG. 6 illustrates a block diagram of the micro-architecture for a processor 600 that includes logic circuits that may execute the system 100 and/or the system 200 of FIG. 2. In some embodiments, an instruction in accordance with one embodiment may be implemented to operate on data elements having sizes of byte, word, doubleword, quadword, etc., as well as datatypes, such as single and double precision integer and floating point datatypes. In one embodiment the in-order front end 601 is the part of the processor 600 that fetches instructions to be executed and prepares them to be used later in the processor pipeline.

The front end 601 may include several units. In one embodiment, the instruction prefetcher 616 fetches instructions from memory and feeds them to an instruction decoder 618 which in turn decodes or interprets them. For example, in one embodiment, the decoder decodes a received instruction into one or more operations called "micro-instructions" or "micro-operations" (also called micro op or uops) that the machine may execute. In other embodiments, the decoder parses the instruction into an opcode and corresponding data and control fields that are used by the micro-architecture to perform operations in accordance with one embodiment. In one embodiment, the trace cache 630 takes decoded uops and assembles them into program ordered sequences or traces in the uop queue 634 for execution. When the trace cache 630 encounters a complex instruction, the microcode ROM (or RAM) 632 may provide the uops needed to complete the operation.

Some instructions are converted into a single micro-op, whereas others need several micro-ops to complete the full operation. In one embodiment, if more than four micro-ops are needed to complete an instruction, the decoder 618 accesses the microcode ROM 632 to do the instruction. For one embodiment, an instruction may be decoded into a small number of micro ops for processing at the instruction decoder 618. In another embodiment, an instruction may be stored within the microcode ROM 632 should a number of micro-ops be needed to accomplish the operation. The trace cache 630 refers to an entry point programmable logic array (PLA) to determine a correct micro-instruction pointer for reading the micro-code sequences to complete one or more instructions in accordance with one embodiment from the micro-code ROM 632. After the microcode ROM 632 finishes sequencing micro-ops for an instruction, the front end 601 of the machine resumes fetching micro-ops from the trace cache 630.

The out-of-order execution engine 603 is where the instructions are prepared for execution. The out-of-order execution logic has a number of buffers to smooth out and reorder the flow of instructions to optimize performance as they go down the pipeline and get scheduled for execution. The allocator logic allocates the machine buffers and resources that each uop needs in order to execute. The register renaming logic renames logic registers onto entries in a register file. The allocator also allocates an entry for each uop in one of the two uop queues, one for memory operations and one for non-memory operations, in front of the instruction schedulers: memory scheduler, fast scheduler 602, slow/general floating point scheduler 604, and simple floating point scheduler 606. The uop schedulers 602, 604, 606, determine when a uop is ready to execute based on the readiness of their dependent input register operand sources and the availability of the execution resources the uops need to complete their operation. The fast scheduler 602 of one embodiment may schedule on each half of the main clock cycle while the other schedulers may only schedule once per main processor clock cycle. The schedulers arbitrate for the dispatch ports to schedule uops for execution.

Register files 608, 610, sit between the schedulers 602, 604, 606, and the execution units 612, 614, 616, 618, 620, 622, 624 in the execution block 611. There is a separate register file 608, 610, for integer and floating point operations, respectively. Each register file 608, 610, of one embodiment also includes a bypass network that may bypass or forward just completed results that have not yet been written into the register file to new dependent uops. The integer register file 608 and the floating point register file 610 are also capable of communicating data with the other. For one embodiment, the integer register file 608 is split into two separate register files, one register file for the low order 32 bits of data and a second register file for the high order 32 bits of data. The floating point register file 610 of one embodiment has 128 bit wide entries because floating point instructions typically have operands from 64 to 128 bits in width.

The execution block 611 contains the execution units 612, 614, 616, 618, 620, 622, 624, where the instructions are actually executed. This section includes the register files 608, 610, that store the integer and floating point data operand values that the micro-instructions need to execute. The processor 600 of one embodiment is comprised of a number of execution units: address generation unit (AGU) 612, AGU 614, fast ALU 616, fast ALU 618, slow ALU 620, floating point ALU 622, floating point move unit 614. For one embodiment, the floating point execution blocks 622, 624, execute floating point, MMX, SIMD, and SSE, or other operations. The floating point ALU 622 of one embodiment includes a 64-bit-by-64-bit floating point divider to execute divide, square root, and remainder micro-ops. For embodiments of the present disclosure, instructions involving a floating point value may be handled with the floating point hardware.

In one embodiment, the ALU operations go to the high-speed ALU execution units 616, 618. The fast ALUs 616, 618, of one embodiment may execute fast operations with an effective latency of half a clock cycle. For one embodiment, most complex integer operations go to the slow ALU 620 as the slow ALU 620 includes integer execution hardware for long latency type of operations, such as a multiplier, shifts, flag logic, and branch processing. Memory load/store operations are executed by the AGUs 612, 614. For one embodiment, the integer ALUs 616, 618, 620, are described in the context of performing integer operations on 64 bit data operands. In alternative embodiments, the ALUs 616, 618, 620, may be implemented to support a variety of data bits including 16, 32, 128, 256, etc. Similarly, the floating point units 622, 624, may be implemented to support a range of operands having bits of various widths. For one embodiment, the floating point units 622, 624, may operate on 128 bits wide packed data operands in conjunction with SIMD and multimedia instructions.

In one embodiment, the uops schedulers 602, 604, 606, dispatch dependent operations before the parent load has finished executing. As uops are speculatively scheduled and executed in processor 600, the processor 600 also includes logic to handle memory misses. If a data load misses in the data cache, there may be dependent operations in flight in the pipeline that have left the scheduler with temporarily incorrect data. A replay mechanism tracks and re-executes instructions that use incorrect data. Only the dependent operations need to be replayed and the independent ones are allowed to complete. The schedulers and replay mechanism of one embodiment of a processor are also designed to catch instruction sequences for text string comparison operations.

The processor 600 also includes logic to implement compression/decompression optimization in solid-state memory devices according to one embodiment. In one embodiment, the execution block 611 of processor 600 may include MCU 115, to perform compression/decompression optimization in solid-state memory devices according to the description herein.

The term "registers" may refer to the on-board processor storage locations that are used as part of instructions to identify operands. In other words, registers may be those that are usable from the outside of the processor (from a programmer's perspective). However, the registers of an embodiment should not be limited in meaning to a particular type of circuit. Rather, a register of an embodiment is capable of storing and providing data, and performing the functions described herein. The registers described herein can be implemented by circuitry within a processor using any number of different techniques, such as dedicated physical registers, dynamically allocated physical registers using register renaming, combinations of dedicated and dynamically allocated physical registers, etc. In one embodiment, integer registers store thirty-two bit integer data. A register file of one embodiment also contains eight multimedia SIMD registers for packed data.

For the discussions herein, the registers are understood to be data registers designed to hold packed data, such as 64 bits wide MMX™ registers (also referred to as 'mm' registers in some instances) in microprocessors enabled with MMX technology from Intel Corporation of Santa Clara, Calif. These MMX registers, available in both integer and floating point forms, can operate with packed data elements that accompany SIMD and SSE instructions. Similarly, 128 bits wide XMM registers relating to SSE2, SSE3, SSE4, or beyond (referred to generically as "SSEx") technology can also be used to hold such packed data operands. In one embodiment, in storing packed data and integer data, the registers do not need to differentiate between the two data types. In one embodiment, integer and floating point are either contained in the same register file or different register files. Furthermore, in one embodiment, floating point and integer data may be stored in different registers or the same registers.

Figure 7:
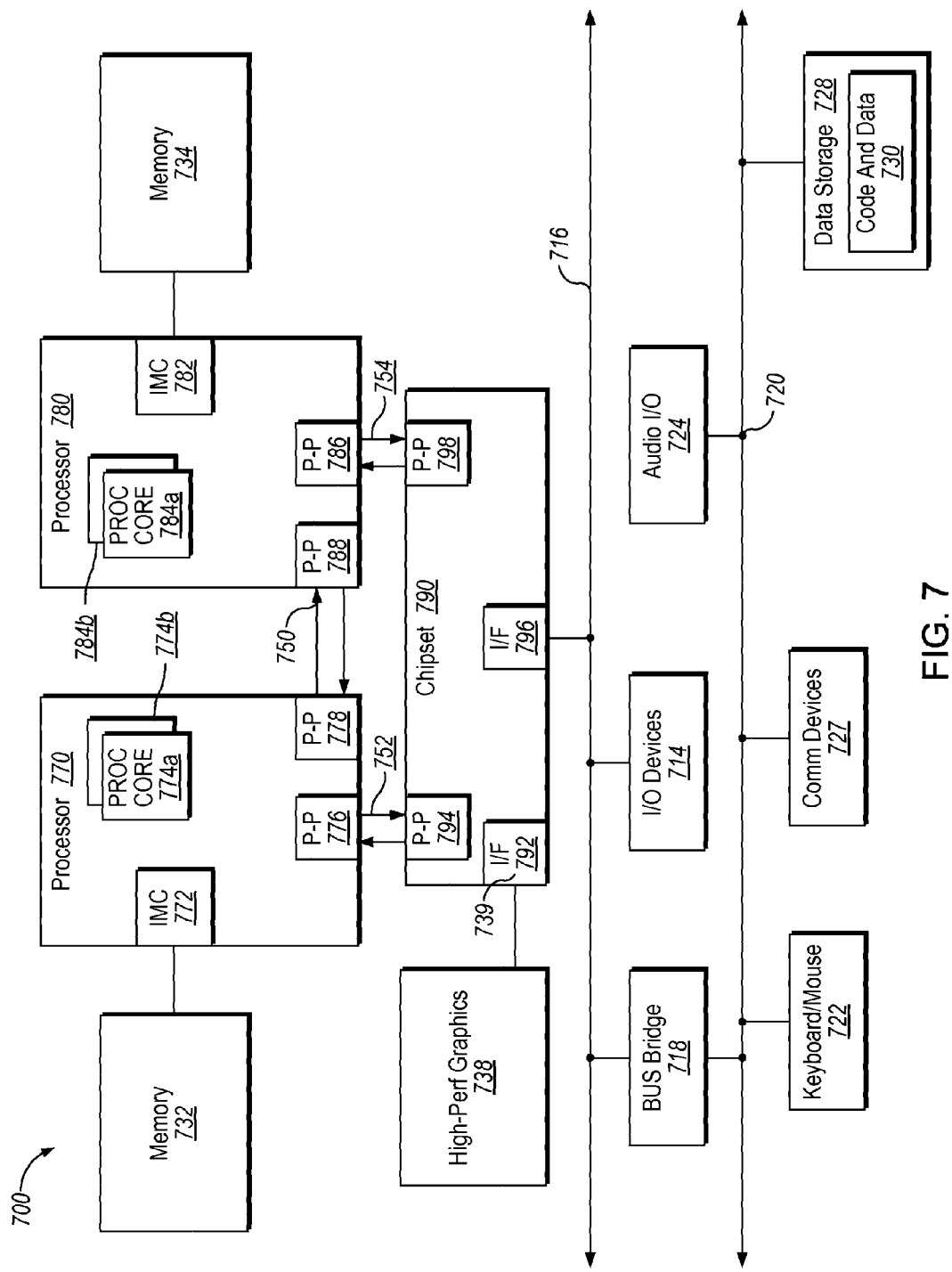
FIG. 7 is a block diagram of a computer system according to one implementation.

Embodiments may be implemented in many different system types. Referring now to FIG. 7, shown is a block diagram of a multiprocessor system 700 in accordance with an implementation. As shown in FIG. 7, multiprocessor system 700 is a point-to-point interconnect system, and includes a first processor 770 and a second processor 780 coupled via a point-to-point interconnect 750. As shown in FIG. 7, each of processors 770 and 780 may be multicore processors, including first and second processor cores (i.e., processor cores 774a and 774b and processor cores 784a and 784b), although potentially many more cores may be present in the processors. The processors each may include hybrid write mode logics in accordance with an embodiment of the present. The embodiments of the page additions and content copying can be implemented in the processor 770, processor 780, or both.

While shown with two processors 770, 780, it is to be understood that the scope of the present disclosure is not so limited. In other implementations, one or more additional processors may be present in a given processor.

Processors 770 and 780 are shown including integrated memory controller units 772 and 782, respectively. Processor 770 also includes as part of its bus controller units point-to-point (P-P) interfaces 776 and 788; similarly, second processor 780 includes P-P interfaces 786 and 788. Processors 770, 780 may exchange information via a point-to-point (P-P) interface 750 using P-P interface circuits 778, 788. As shown in FIG. 7, IMCs 772 and 782 couple the processors to respective memories, namely a memory 732 and a memory 734, which may be portions of main memory locally attached to the respective processors.

Processors 770, 780 may each exchange information with a chipset 790 via individual P-P interfaces 752, 754 using point to point interface circuits 776, 794, 786, 798. Chipset 790 may also exchange information with a high-performance graphics circuit 738 via a high-performance graphics interface 739.

A shared cache (not shown) may be included in either processor or outside of both processors, yet connected with the processors via P-P interconnect, such that either or both processors' local cache information may be stored in the shared cache if a processor is placed into a low power mode.

Chipset 790 may be coupled to a first bus 716 via an interface 796. In one embodiment, first bus 716 may be a Peripheral Component Interconnect (PCI) bus, or a bus such as a PCI Express bus or another third generation I/O interconnect bus, although the scope of the present disclosure is not so limited.

As shown in FIG. 7, various I/O devices 714 may be coupled to first bus 716, along with a bus bridge 718 which couples first bus 716 to a second bus 720. In one embodiment, second bus 720 may be a low pin count (LPC) bus. Various devices may be coupled to second bus 720 including, for example, a keyboard and/or mouse 722, communication devices 727 and a storage unit 728 such as a disk drive or other mass storage device which may include instructions/code and data 730, in one embodiment. Further, an audio I/O 724 may be coupled to second bus 720. Note that other architectures are possible. For example, instead of the point-to-point architecture of FIG. 7, a system may implement a multi-drop bus or other such architecture.

Figure 8:
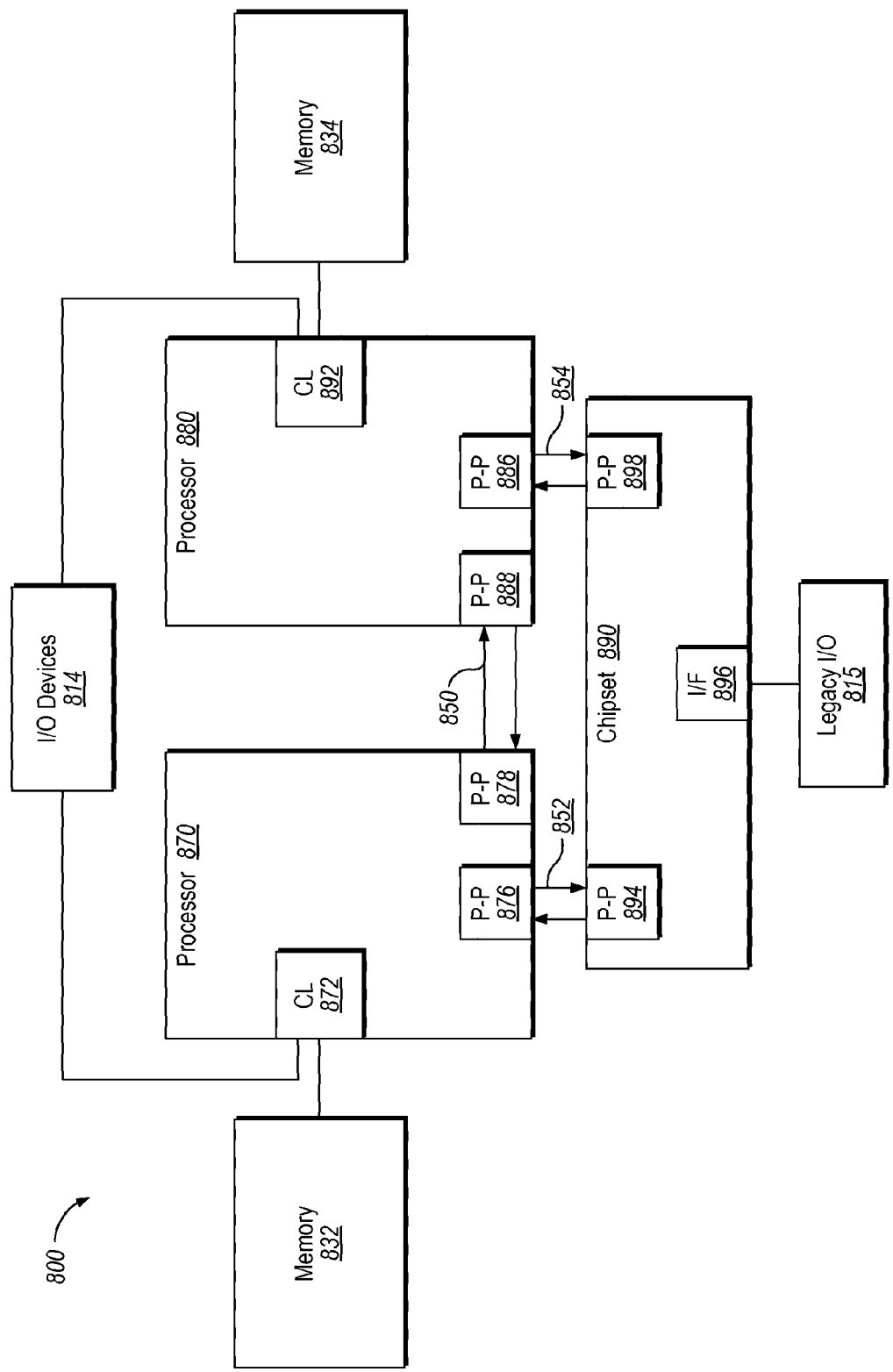
FIG. 8 is a block diagram of a computer system according to another implementation.

Referring now to FIG. 8, shown is a block diagram of a third system 800 in accordance with an embodiment of the present disclosure. Like elements in FIGS. 7 and 8 bear like reference numerals, and certain aspects of FIG. 7 have been omitted from FIG. 7 in order to avoid obscuring other aspects of FIG. 8.

FIG. 8 illustrates that the processors 870, 880 may include integrated memory and I/O control logic ("CL") 872 and 882, respectively. For at least one embodiment, the CL 872, 882 may include integrated memory controller units such as described herein. In addition, CL 872, 882 may also include I/O control logic. FIG. 8 illustrates that the memories 832, 834 are coupled to the CL 872, 882, and that I/O devices 814 are also coupled to the control logic 872, 882. Legacy I/O devices 815 are coupled to the chipset 890. The embodiments of the page additions and content copying can be implemented in processor 870, processor 880, or both.

Figure 9:
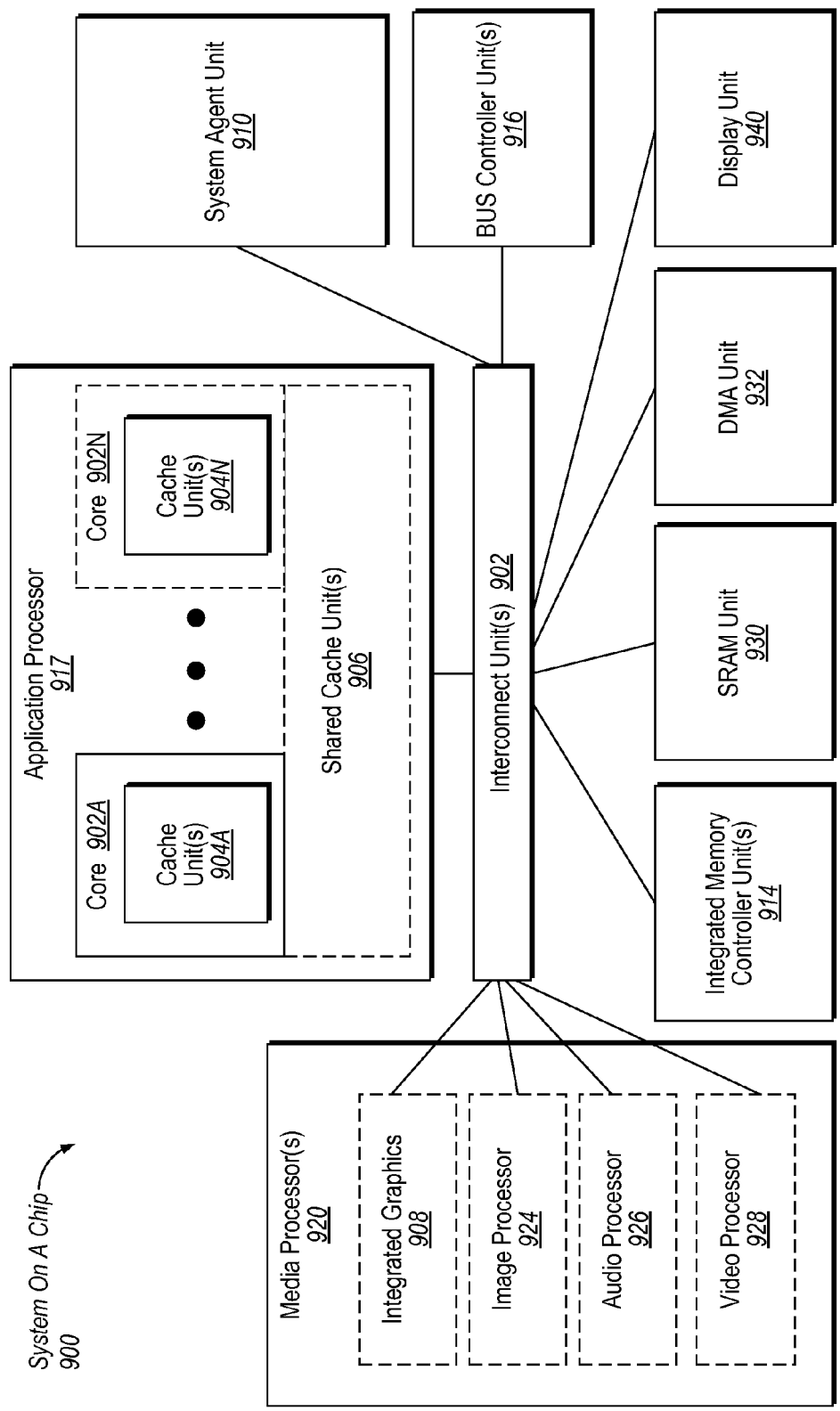
FIG. 9 is a block diagram of a system-on-a-chip according to one implementation.

FIG. 9 is an exemplary system on a chip (SoC) 900 that may include one or more of the cores 902. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

FIG. 9 is a block diagram of a SoC 900 in accordance with an embodiment of the present disclosure. Dashed lined boxes are features on more advanced SoCs. In FIG. 9 an interconnect unit(s) 902 is coupled to: an application processor 917 which includes a set of one or more cores 902A-N and shared cache unit(s) 906; a system agent unit 910; a bus controller unit(s) 916; an integrated memory controller unit(s) 914; a set or one or more media processors 920 which may include integrated graphics logic 908, an image processor 924 for providing still and/or video camera functionality, an audio processor 926 for providing hardware audio acceleration, and a video processor 928 for providing video encode/decode acceleration; a static random access memory (SRAM) unit 930; a direct memory access (DMA) unit 932; and a display unit 940 for coupling to one or more external displays. The embodiments of the pages additions and content copying can be implemented in SoC 900.

Figure 10:
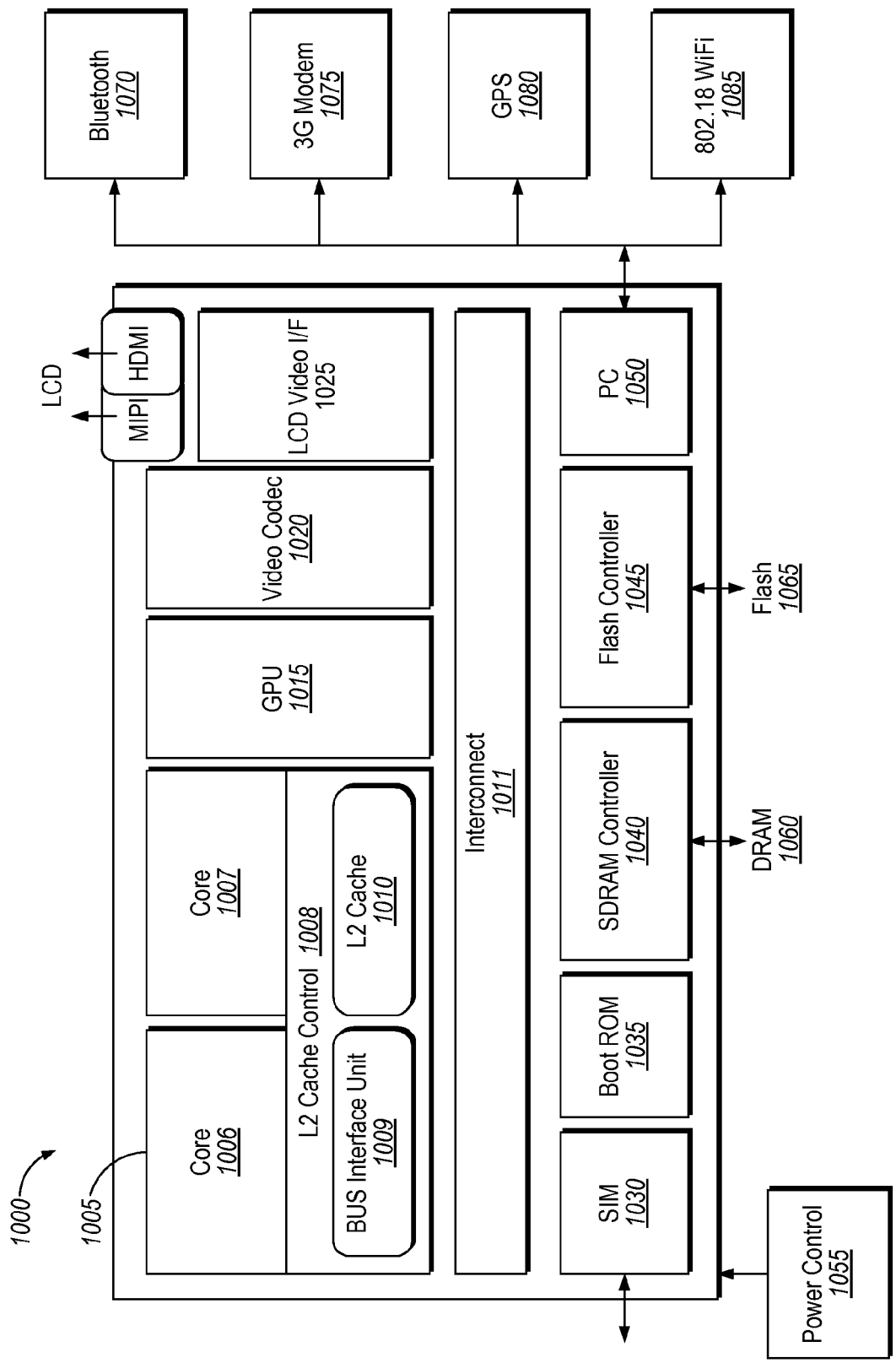
FIG. 10 illustrates another implementation of a block diagram for a computing system.

Turning next to FIG. 10, an embodiment of a system on-chip (SoC) design in accordance with embodiments of the disclosure is depicted. As an illustrative example, SoC 1000 is included in user equipment (UE). In one embodiment, UE refers to any device to be used by an end-user to communicate, such as a hand-held phone, smartphone, tablet, ultra-thin notebook, notebook with broadband adapter, or any other similar communication device. A UE may connect to a base station or node, which can correspond in nature to a mobile station (MS) in a GSM network. The embodiments of the page additions and content copying can be implemented in SoC 1000.

Here, SoC 1000 includes 2 cores—1006 and 1007. Similar to the discussion above, cores 1006 and 1007 may conform to an Instruction Set Architecture, such as a processor having the Intel® Architecture Core™, an Advanced Micro Devices, Inc. (AMD) processor, a MIPS-based processor, an ARM-based processor design, or a customer thereof, as well as their licensees or adopters. Cores 1006 and 1007 are coupled to cache control 1008 that is associated with bus interface unit 1009 and L2 cache 1010 to communicate with other parts of SOC 1000. Interconnect 1011 includes an on-chip interconnect, such as an IOSF, AMBA, or other interconnects discussed above, which can implement one or more aspects of the described disclosure.

Interconnect 1011 provides communication channels to the other components, such as a Subscriber Identity Module (SIM) 1030 to interface with a SIM card, a boot ROM 1035 to hold boot code for execution by cores 1006 and 1007 to initialize and boot SoC 1000, a SDRAM controller 1040 to interface with external memory (e.g. DRAM 1060), a flash controller 1045 to interface with non-volatile memory (e.g. Flash 1065), a peripheral control 1050 (e.g. Serial Peripheral Interface) to interface with peripherals, video codecs 1020 and Video interface 1025 to display and receive input (e.g. touch enabled input), GPU 1015 to perform graphics related computations, etc. Any of these interfaces may incorporate aspects of the embodiments described herein.

In addition, the system illustrates peripherals for communication, such as a Bluetooth module 1070, 3G modem 1075, GPS 1080, and Wi-Fi 1085. Note as stated above, a UE includes a radio for communication. As a result, these peripheral communication modules may not all be included. However, in a UE some form of a radio for external communication should be included.

Figure 11:
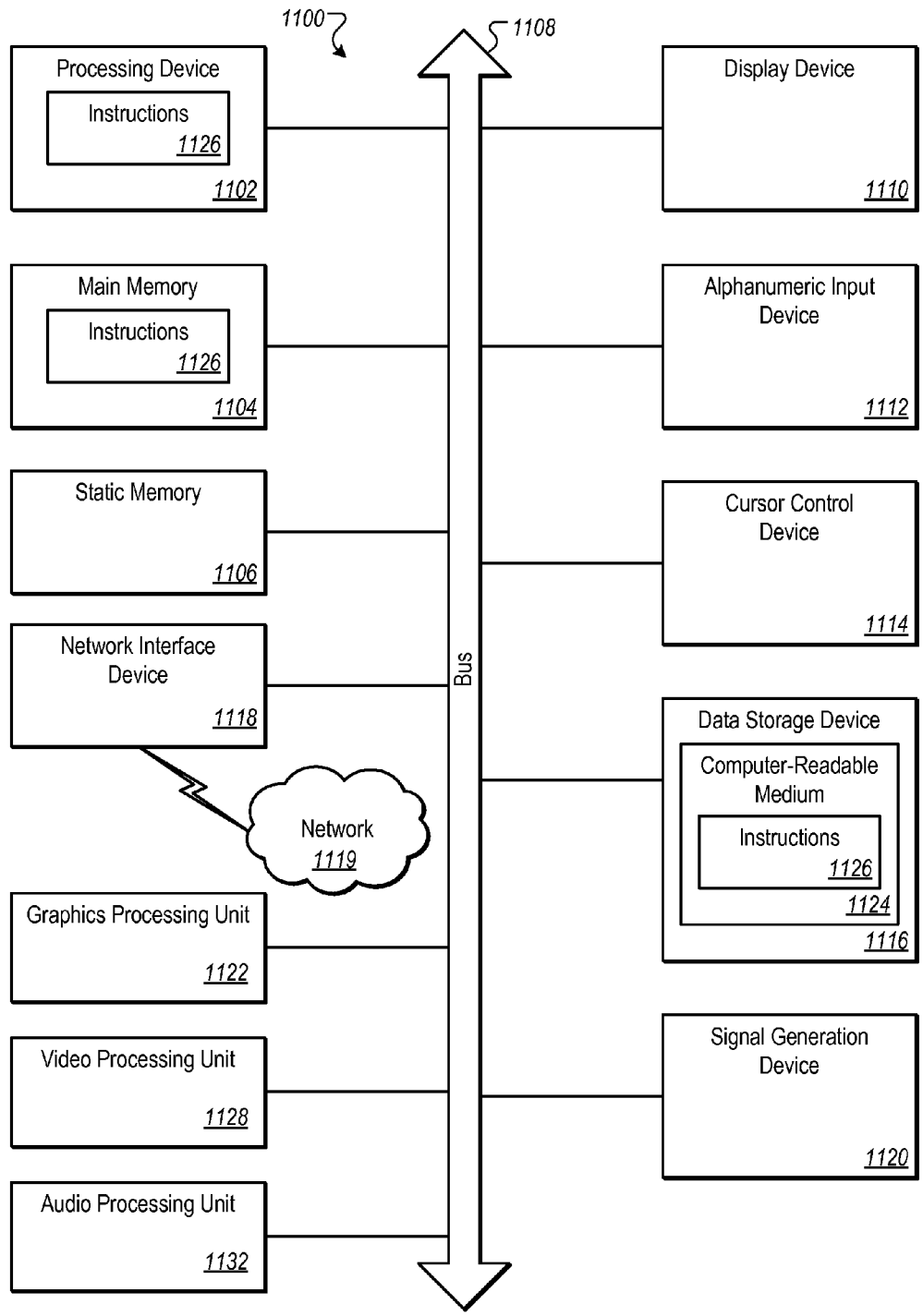
FIG. 11 illustrates another implementation of a block diagram for a computing system.

FIG. 11 illustrates a diagrammatic representation of a machine in the example form of a computing system 1100 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client device in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. The embodiments that execute the system 100 of FIG. 1 or the system 200 of FIG. 2 may be implemented in the computing system 1100.

The computing system 1100 includes a processing device 1102, main memory 1104 (e.g., flash memory, dynamic random access memory (DRAM) (such as synchronous DRAM (SDRAM) or DRAM (RDRAM), etc.), a static memory 1106 (e.g., flash memory, static random access memory (SRAM), etc.), and a data storage device 1116, which communicate with each other via a bus 1108.

Processing device 1102 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 1102 may also be one or more special-purpose processing devices such as an application specific integrated circuit (ASIC), a field programmable gate array (FPGA), a digital signal processor (DSP), network processor, or the like. In one embodiment, processing device 1102 may include one or processor cores. The processing device 1102 is configured to execute the processing logic or instructions 1126 for performing the operations discussed herein.

In one embodiment, processing device 1102 may be the processing device 100 of FIG. 1. Alternatively, the computing system 1100 may include other components as described herein. It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

The computing system 1100 may further include a network interface device 1118 communicably coupled to a network 1119. The computing system 1100 also may include a video display device 1110 (e.g., a liquid crystal display (LCD) or a cathode ray tube (CRT)), an alphanumeric input device 1112 (e.g., a keyboard), a cursor control device 1114 (e.g., a mouse), a signal generation device 1120 (e.g., a speaker), or other peripheral devices. Furthermore, computing system 1100 may include a graphics processing unit 1122, a video processing unit 1128 and an audio processing unit 1132. In another embodiment, the computing system 1100 may include a chipset (not illustrated), which refers to a group of integrated circuits, or chips, that are designed to work with the processing device 1102 and controls communications between the processing device 1102 and external devices. For example, the chipset may be a set of chips on a motherboard that links the processing device 1102 to very high-speed devices, such as main memory 1104 and graphic controllers, as well as linking the processing device 1102 to lower-speed peripheral buses of peripherals, such as USB, PCI or ISA buses.

The data storage device 1116 may include a computer-readable storage medium 1124 on which is stored software 1126 embodying any one or more of the methodologies of functions described herein. The software 1126 may also reside, completely or at least partially, within the main memory 1104 as instructions 1126 and/or within the processing device 1102 as processing logic during execution thereof by the computing system 1100; the main memory 1104 and the processing device 1102 also constituting computer-readable storage media.

The computer-readable storage medium 1124 may also be used to store instructions 1126 utilizing the processing device 1102, such as described with respect to FIGS. 1-4, and/or a software library containing methods that call the above applications. While the computer-readable storage medium 1124 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instruction for execution by the machine and that cause the machine to perform any one or more of the methodologies of the present embodiments. The term "computer-readable storage medium" shall accordingly be taken to include, but not be limited to, solid-state memories, and optical and magnetic media.

The following examples pertain to further embodiments.

Example 1 is a processor comprising: 1) a hardware string matcher to string match various substrings of an input stream and to generate an intermediate token format of respective substring matches; 2) a processor core to execute first instructions as an entropy code generator to generate entropy codes from frequencies of tokens corresponding to respective substring matches; and 3) a decompression engine to generate at least two outputs indicative of error checks of the input stream as the input stream is being compressed, wherein the processor core is to execute second instructions to generate one of the at least two outputs.

In Example 2, the processor of Example 1, wherein the hardware string matcher comprises an LZ77 compressor.

In Example 3, the processor of Example 1, wherein the processor core is to execute the second instructions to perform an inverse operation that generates a bit stream from the intermediate token format of respective substring matches, further comprising a comparator to compare the input stream with the bit stream and to generate a fault or exception in response to determining an error in matching the input stream and the bit stream.

In Example 4, the processor of Example 1, further comprising an entropy code encoder to encode a final compressed output of the input stream utilizing the entropy codes.

In Example 5, the processor of Examples 1-4, wherein the decompression engine comprises: a) a hardware decoder to partially decompress the final compressed output to reverse encoding of the entropy code encoder, to generate a partially decompressed output; and b) a comparator to compare an output of the entropy code generator to the partially decompressed output and to generate a fault or exception in response to determining an error in matching the output of the entropy code generator to the partially decompressed output.

In Example 6, the processor of Examples 1-5, wherein the entropy code generator is a tree generator to generate a Huffman tree from the frequencies of the tokens.

In Example 7, the processor of Example 6, wherein the entropy code encoder comprises a Huffman encoder to generate the final compressed output from the Huffman tree.

Various embodiments may have different combinations of the structural features described above. For instance, all optional features of the computing system described above may also be implemented with respect to the method or process described herein and specifics in the examples may be used anywhere in one or more embodiments.

Example 8 is an device comprising: 1) a compressor to compress an input stream of data, the compressor comprising: a) a hardware string matcher to string match various substrings of the input stream and to generate an intermediate token format of respective substring matches; b) a processor core to execute first instructions as an entropy code generator to generate entropy codes from frequencies of tokens corresponding to respective substring matches; and 2) a decompression engine comprising: a) the processor core to execute second instructions as an inverse string matcher to generate a bit stream from the intermediate token format of respective substring matches; and b) a first comparator to compare the input stream with the bit stream and to generate a first fault or exception in response to determining an error in matching the input stream and the bit stream.

In Example 9, the device of Example 8, wherein the hardware string matcher comprises an LZ77 compressor.

In Example 10, the device of Examples 9-10, wherein the compressor further comprises an entropy code encoder to encode a final compressed output of the input stream utilizing the entropy codes.

In Example 11, the device of Example 10, wherein the entropy code generator is a tree generator to generate a Huffman tree from the frequencies of the tokens, and wherein the entropy code encoder comprises a Huffman encoder to generate the final compressed output from the Huffman tree.

In Example 12, the device of Examples 9-11, wherein the decompression engine further comprises: a) a decoder to partially decompress the final compressed output to reverse encoding of the entropy code encoder, to generate a partially decompressed output; and b) a comparator to compare an output of the entropy code generator to the partially decompressed output and to generate a second fault or exception in response to determining an error in matching the output of the entropy code generator to the partially decompressed output.

In Example 13, the device of Example 12, wherein the first fault or exception comprises a machine check architecture (MCA) fault distinguishable from the second fault or exception, and wherein the at least one processor is further to: a) track, within a log, a first frequency of generation of the first fault or exception; and b) track, within the log, a second frequency of generation of the second fault or exception.

Various embodiments may have different combinations of the structural features described above. For instance, all optional features of the processors and methods described above may also be implemented with respect to a system described herein and specifics in the examples may be used anywhere in one or more embodiments.

Example 14 is an error-checking, data compression system, comprising: 1) a compression engine to compress an input stream of data, the compression engine comprising: a) a hardware string matcher to string match various substrings of the input stream and to generate an intermediate token format of respective substring matches; b) a processor core to execute first instructions as an entropy code generator to generate entropy codes from frequencies of tokens corresponding to respective substring matches; and c) a hardware entropy code encoder to encode a final compressed output of the input stream utilizing the entropy codes; and 2) a decompression engine to error check compression of the input steam, the decompression engine comprising: a) the processor core to execute second instructions as an inverse string matcher to generate a bit stream from the intermediate token format of respective substring matches; b) a first comparator to compare the input stream with the bit stream and to generate a first fault or exception in response to determining an error in matching the input stream and the bit stream; c) a hardware decoder to partially decompress the final compressed output to reverse encoding of the entropy code encoder, to generate a partially decompressed output; and d) a second comparator to compare an output of the entropy code generator to the partially decompressed output and to generate a second fault or exception in response to determining an error in matching the output of the entropy code generator to the partially decompressed output.

In Example 15, the system of Example 14, wherein the first fault or exception comprises a machine check architecture (MCA) fault distinguishable from the second fault or exception, and wherein the at least one processor is further to: a) track, within a log, a first frequency of generation of the first fault or exception; b) track, within the log, a second frequency of generation of the second fault or exception; and c) report the first frequency and the second frequency to a system administrator.

In Example 16, the system of Examples 14-15, wherein the hardware string matcher comprises an LZ77 compressor.

In Example 17, the system of Examples 15-16, wherein the entropy code generator is a tree generator to generate a Huffman tree from the frequencies of the tokens, and wherein the hardware entropy code encoder comprises a Huffman encoder to generate the final compressed output from the Huffman tree.

Various embodiments may have different combinations of the structural features described above. For instance, all optional features of the processors and methods described above may also be implemented with respect to a system described herein and specifics in the examples may be used anywhere in one or more embodiments.

Example 18 is a method comprising: 1) compressing an input stream of data with a heterogeneous compressor, wherein a first portion of the heterogeneous compressor comprises specialized hardware and a second portion of the heterogeneous compressor is executed as software; 2) decompressing at least two outputs of the compressor to generate at least two decompressed outputs; and 3) performing error checking of the at least two decompressed outputs with corresponding inputs to identify any mismatches within a compressed stream being created by the compressor.

In Example 19, the method of Example 18, wherein the heterogeneous compressor comprises: a) a hardware string matcher to string match various substrings of an input stream and to generate an intermediate token format of respective substring matches; b) a processor core to execute first instructions as an entropy code generator to generate entropy codes from frequencies of tokens corresponding to respective substring matches; and c) a hardware entropy code encoder to encode a final compressed output of the input stream utilizing the entropy codes.

In Example 20, the method of Example 19, wherein the processor core is to execute second instructions to generate one of the at least two outputs, wherein the decompressing further comprises: a) executing an inverse operation by executing the second instructions to generate a bit stream from the intermediate token format of respective substring matches generated by the string matcher; b) comparing the input stream with the bit stream; and c) generating a fault or exception in response to determining an error in matching the input stream and the bit stream.

In Example 21, the method of Examples 19-20, wherein the decompressing further comprises: a) partially decompressing the final compressed output to reverse encoding of the entropy code encoder, to generate a partially decompressed output; b) comparing an output of the entropy code generator to the partially decompressed output; and c) generating a fault or exception in response to determining an error in matching the output of the entropy code generator to the partially decompressed output.

In Example 22, the method of Examples 19-22, wherein the hardware string matcher comprises an LZ77 compressor.

In Example 23, the method of Examples 19-22, wherein the entropy code generator is a tree generator to generate a Huffman tree from the frequencies of the tokens, and wherein the third compression stage comprises a Huffman encoder to generate the final compressed output from the Huffman tree.

While the present disclosure has been described with respect to a limited number of embodiments, those skilled in the art will appreciate numerous modifications and variations therefrom. It is intended that the appended claims cover all such modifications and variations as fall within the true spirit and scope of this present disclosure.

In the description herein, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system have not been described in detail in order to avoid unnecessarily obscuring the present disclosure.

The embodiments are described with reference to compression/decompression optimization in solid-state memory devices in specific integrated circuits, such as in computing platforms or microprocessors. The embodiments may also be applicable to other types of integrated circuits and programmable logic devices. For example, the disclosed embodiments are not limited to desktop computer systems or portable computers, such as the Intel® Ultrabooks™ computers. And may be also used in other devices, such as handheld devices, tablets, other thin notebooks, systems on a chip (SoC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. It is described that the system can be any kind of computer or embedded system. The disclosed embodiments may especially be used for low-end devices, like wearable devices (e.g., watches), electronic implants, sensory and control infrastructure devices, controllers, supervisory control and data acquisition (SCADA) systems, or the like. Moreover, the apparatuses, methods, and systems described herein are not limited to physical computing devices, but may also relate to software optimizations for energy conservation and efficiency. As will become readily apparent in the description below, the embodiments of methods, apparatuses, and systems described herein (whether in reference to hardware, firmware, software, or a combination thereof) are vital to a 'green technology' future balanced with performance considerations.

Although the embodiments herein are described with reference to a processor, other embodiments are applicable to other types of integrated circuits and logic devices. Similar techniques and teachings of embodiments of the present disclosure can be applied to other types of circuits or semiconductor devices that can benefit from higher pipeline throughput and improved performance. The teachings of embodiments of the present disclosure are applicable to any processor or machine that performs data manipulations. However, the present disclosure is not limited to processors or machines that perform 512 bit, 256 bit, 128 bit, 64 bit, 32 bit, or 16 bit data operations and can be applied to any processor and machine in which manipulation or management of data is performed. In addition, the description herein provides examples, and the accompanying drawings show various examples for the purposes of illustration. However, these examples should not be construed in a limiting sense as they are merely intended to provide examples of embodiments of the present disclosure rather than to provide an exhaustive list of all possible implementations of embodiments of the present disclosure.

Although the below examples describe instruction handling and distribution in the context of execution units and logic circuits, other embodiments of the present disclosure can be accomplished by way of a data or instructions stored on a machine-readable, tangible medium, which when performed by a machine cause the machine to perform functions consistent with at least one embodiment of the disclosure. In one embodiment, functions associated with embodiments of the present disclosure are embodied in machine-executable instructions. The instructions can be used to cause a general-purpose or special-purpose processor that is programmed with the instructions to perform the steps of the present disclosure. Embodiments of the present disclosure may be provided as a computer program product or software which may include a machine or computer-readable medium having stored thereon instructions which may be used to program a computer (or other electronic devices) to perform one or more operations according to embodiments of the present disclosure. Alternatively, operations of embodiments of the present disclosure might be performed by specific hardware components that contain fixed-function logic for performing the operations, or by any combination of programmed computer components and fixed-function hardware components.

Instructions used to program logic to perform embodiments of the disclosure can be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer)

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like. The blocks described herein can be hardware, software, firmware or a combination thereof.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "defining," "receiving," "determining," "issuing," "linking," "associating," "obtaining," "authenticating," "prohibiting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Also, the terms "first," "second," "third," "fourth," etc. as used herein are meant as labels to distinguish among different elements and may not necessarily have an ordinal meaning according to their numerical designation.

What is claimed is:

1. A processor comprising:
    a compression engine comprising:
        a hardware string matcher to string match various substrings of an input stream and to generate an intermediate token format of respective substring matches;
        a processor core to execute first instructions as an entropy code generator to generate entropy codes from frequencies of tokens corresponding to respective substring matches; and
        an entropy code encoder to encode, from the entropy codes, a final compressed output of the input stream; and
    a decompression engine coupled to the compression engine, the decompression engine to generate a first output from the intermediate token format and a second output from a partially decompressed output of the final compressed output, wherein the first output and the second output being indicative of error checks of the input stream as the input stream is compressed.

2. The processor of claim 1, wherein the hardware string matcher comprises an LZ77 compressor.

3. The processor of claim 1, wherein the processor core is to execute second instructions to perform an inverse operation that generates a bit stream from the intermediate token format of respective substring matches, further comprising a comparator to compare the input stream with the bit stream and to generate a fault or exception, as the first output, in response to determination of an error in a match between the input stream and the bit stream.

4. The processor of claim 1, wherein the decompression engine comprises:
 a hardware decoder to partially decompress the final compressed output to reverse encoding of the entropy code encoder, to generate the partially decompressed output; and
 a comparator to compare an output of the entropy code generator to the partially decompressed output and to generate a fault or exception, as the second output, in response to determination of an error in a match between the output of the entropy code generator to the partially decompressed output.

5. The processor of claim 1, wherein the entropy code generator is a tree generator to generate a Huffman tree from the frequencies of the tokens.

6. The processor of claim 5, wherein the entropy code encoder comprises a Huffman encoder to generate the final compressed output from the Huffman tree.

7. A device comprising:
 a compressor to compress an input stream of data, the compressor comprising:
  a hardware string matcher to string match various substrings of the input stream and to generate an intermediate token format of respective substring matches; and
  a processor core to execute first instructions as an entropy code generator to generate entropy codes from frequencies of tokens corresponding to respective substring matches; and
 a decompression engine coupled to the compressor, the decompression engine comprising:
  the processor core to execute second instructions as an inverse string matcher to generate a bit stream from the intermediate token format of respective substring matches; and
  a first comparator to compare the input stream with the bit stream and to generate a first fault or exception in response to determination of an error in a match between the input stream and the bit stream.

8. The device of claim 7, wherein the hardware string matcher comprises an LZ77 compressor.

9. The device of claim 7, wherein the compressor further comprises an entropy code encoder to encode, from the entropy codes, a final compressed output of the input stream.

10. The device of claim 9, wherein the entropy code generator is a tree generator to generate a Huffman tree from the frequencies of the tokens, and wherein the entropy code encoder comprises a Huffman encoder to generate the final compressed output from the Huffman tree.

11. The device of claim 9, wherein the decompression engine further comprises:
 a decoder to partially decompress the final compressed output to reverse encoding of the entropy code encoder, to generate a partially decompressed output; and
 a comparator to compare an output of the entropy code generator to the partially decompressed output and to generate a second fault or exception in response to determination of an error in a match between the output of the entropy code generator to the partially decompressed output.

12. The device of claim 11, wherein the first fault or exception comprises a machine check architecture (MCA) fault distinguishable from the second fault or exception, and wherein the at least one processor is further to:
 track, within a log, a first frequency of generation of the first fault or exception; and
 track, within the log, a second frequency of generation of the second fault or exception.

13. An error-checking, data compression system, comprising:
 a compression engine to compress an input stream of data, the compression engine comprising:
  a hardware string matcher to string match various substrings of the input stream and to generate an intermediate token format of respective substring matches;
  a processor core to execute first instructions as an entropy code generator to generate entropy codes from frequencies of tokens corresponding to respective substring matches; and
  a hardware entropy code encoder to encode, from the entropy codes, a final compressed output of the input stream; and
 a decompression engine coupled to the compression engine, the decompression engine to error check compression of the input stream, the decompression engine comprising:
  the processor core to execute second instructions as an inverse string matcher to generate a bit stream from the intermediate token format of respective substring matches;
  a first comparator to compare the input stream with the bit stream and to generate a first fault or exception in response to determination of an error in a match between the input stream and the bit stream;
  a hardware decoder to partially decompress the final compressed output to reverse encoding of the entropy code encoder, to generate a partially decompressed output; and
  a second comparator to compare an output of the entropy code generator to the partially decompressed output and to generate a second fault or exception in response to determination of an error in a match between the output of the entropy code generator to the partially decompressed output.

14. The system of claim 13, wherein the first fault or exception comprises a machine check architecture (MCA) fault distinguishable from the second fault or exception, and wherein the at least one processor is further to:
 track, within a log, a first frequency of generation of the first fault or exception;
 track, within the log, a second frequency of generation of the second fault or exception; and
 report the first frequency and the second frequency to a system administrator.

15. The system of claim 13, wherein the hardware string matcher comprises an LZ77 compressor.

16. The system of claim 13, wherein the entropy code generator is a tree generator to generate a Huffman tree from the frequencies of the tokens, and wherein the hardware entropy code encoder comprises a Huffman encoder to generate the final compressed output from the Huffman tree.

17. A method comprising:
 compressing an input stream of data with a heterogeneous compressor, wherein the compressing comprises:
  generating, with a hardware string matcher, an intermediate token format of substring matches within the input stream;
  generating, with an entropy code generator, entropy codes from frequencies of tokens corresponding to respective substring matches; and generating, with a hardware entropy code encoder, from the entropy codes, a final compressed output of the input stream;

decompressing the intermediate token format and the final compressed output of the compressor to generate a first decompressed output and a second decompressed output, respectively; and performing error checking of the first decompressed output and the second decompressed output with corresponding inputs to identify any mismatches within a compressed stream being created by the compressor.

18. The method of claim 17, wherein a processor core is to execute first instructions to implement the entropy code generator, wherein the decompressing and the performing the error checking comprises:

executing second instructions, by the processor core, to perform an inverse operation generating a bit stream, as the first decompressed output, from the intermediate token format of respective substring matches generated by the hardware string matcher;

comparing the input stream with the bit stream; and generating a fault or exception in response to determining an error in matching the input stream and the bit stream.

19. The method of claim 18, wherein the fault or exception comprises a machine check architecture (MCA) fault, the method further comprising tracking, within a log, a frequency of generation of the fault or exception.

20. The method of claim 17, wherein the decompressing and performing the error checking comprises:

partially decompressing the final compressed output to reverse the encoding of the hardware entropy code encoder, generating a partially decompressed output;

comparing an output of the entropy code generator to the partially decompressed output; and generating a fault or exception in response to determining an error in matching the output of the entropy code generator to the partially decompressed output.

21. The method of claim 20, further comprising tracking, within a log, a frequency of generation of the fault or exception.

22. The method of claim 17, wherein the hardware string matcher comprises an LZ77 compressor.

23. The method of claim 17, wherein the entropy code generator is a tree generator to generate a Huffman tree from the frequencies of the tokens, and wherein the hardware entropy code encoder comprises a Huffman encoder to generate the final compressed output from the Huffman tree.

* * * * *